United States Patent [19]

Hesterman et al.

[11] 4,439,732

[45] Mar. 27, 1984

[54] ELECTRICALLY BALANCED FLUXGATE GRADIOMETERS

[75] Inventors: Victor W. Hesterman, Los Altos Hills; William E. Drummond, Mountain View, both of Calif.

[73] Assignee: Unied Scientific Corporation, Santa Clara, Calif.

[21] Appl. No.: 266,826

[22] Filed: May 26, 1981

[51] Int. Cl.³ ............... G01R 33/02; G01R 33/04; G01C 17/28; G01V 3/165

[52] U.S. Cl. .................................. 324/247; 324/253; 324/345; 33/361

[58] Field of Search .............................. 324/244–248, 324/253, 258, 260, 261, 200, 345, 326, 225, 254, 255, 331, 346; 33/356, 357, 361

[56] References Cited

U.S. PATENT DOCUMENTS

| | | | |
|---|---|---|---|
| 3,126,510 | 3/1964 | McLaughlin et al. | 324/345 |
| 3,281,660 | 10/1966 | Studenick | 324/245 |
| 3,639,828 | 2/1972 | Salvi | 324/244 |
| 3,644,825 | 2/1972 | Davis, Jr. et al. | 324/247 |
| 3,649,908 | 3/1972 | Brown | 324/253 |

*Primary Examiner*—Gerard R. Strecker
*Assistant Examiner*—Warren S. Edmonds
*Attorney, Agent, or Firm*—Flehr, Hohbach, Test, Albritton & Herbert

[57] ABSTRACT

A gradiometer for measuring magnetic field gradients. The gradiometer is formed by a number of magnetic field sensing devices. Each device has its own axis of sensitivity and produces a signal proportional to the magnetic field strength in the direction of its axis of sensitivity. The devices are mounted so that the different axes of sensitivity are at different angles to each other and so that at least some of the devices are displaced from each other along a common axis. The signals from the devices are combined so as to balance out unwanted components, particularly those due to the earth's magnetic field.

24 Claims, 8 Drawing Figures

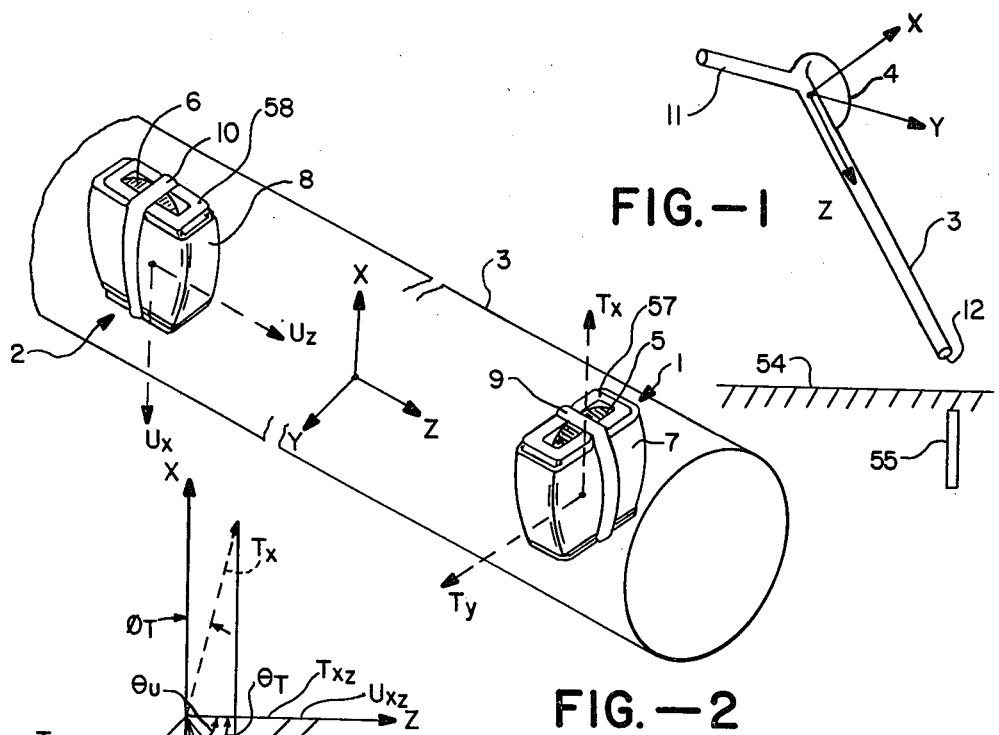
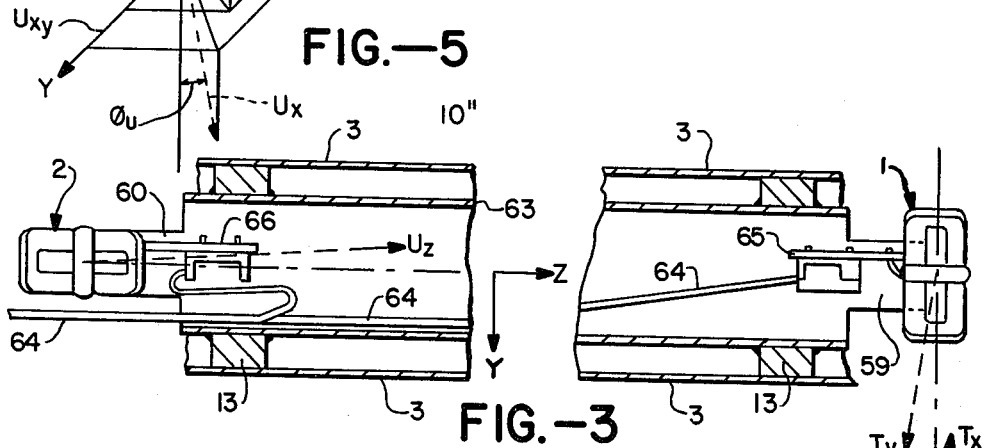
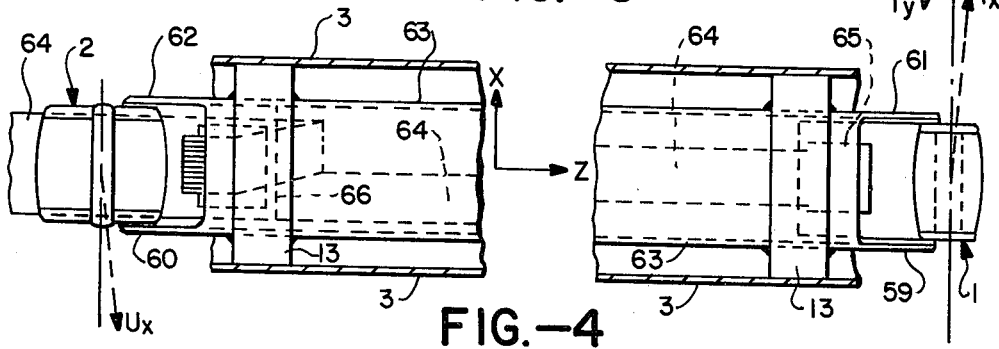

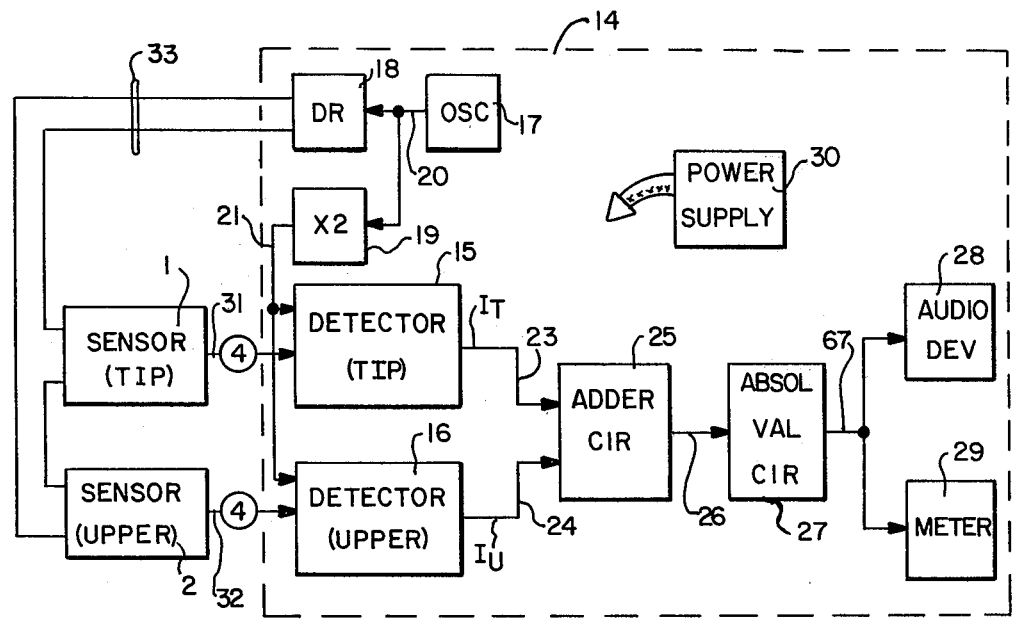
FIG.—6
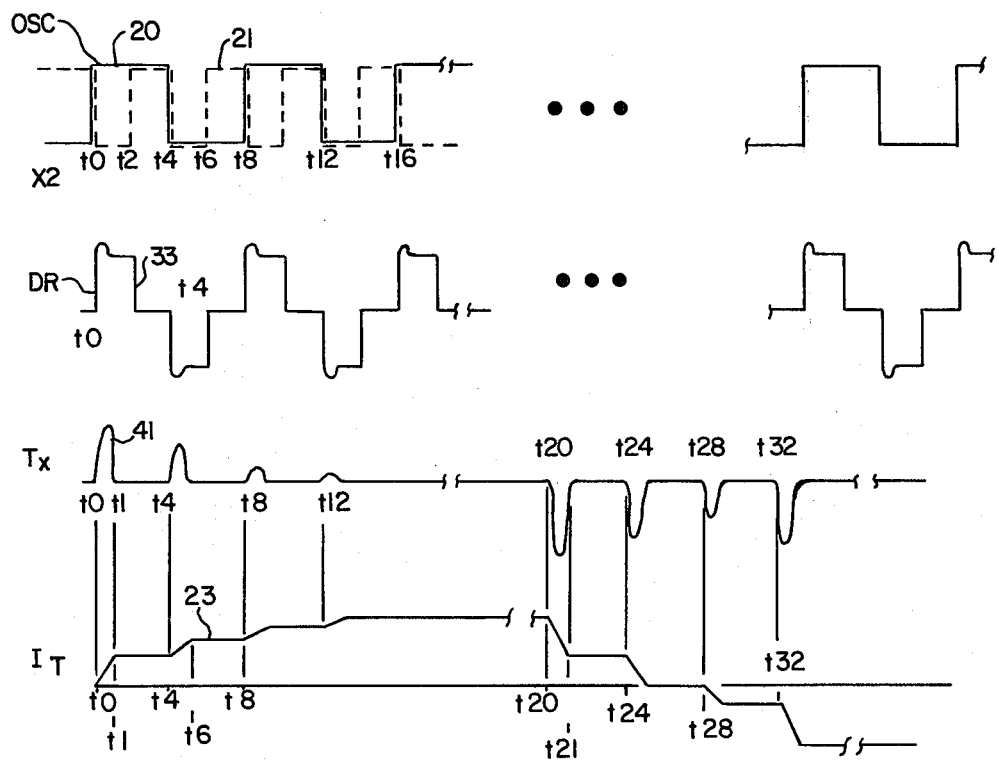
FIG.—8

ELECTRICALLY BALANCED FLUXGATE GRADIOMETERS

BACKGROUND OF THE INVENTION

The present invention relates to an apparatus and method for sensing the presence of a magnetic field and particularly to magnetometers and gradiometers for sensing magnetic field gradients.

Magnetometers and gradiometers are well-known devices for measuring and sensing magnetic fields. By way of background, such devices are described in the following articles: *IEEE Transactions on Geoscience Electronics*, October 1970, "Lunar Surface Magnetometer", by Dyal et al, pgs. 206–208; *IEEE Transactions on Magnetics*, Vol. Mag-6, No. 2, June 1970, "The Fluxgate Mechanism, Part I: The Gating Curves of Parallel and Orthogonal Fluxgates", by Fritz Prindahl, pgs. 376–382; and *IEEE Transactions on Geoscience Electronics*, Vol. GE-7, No. 4, October 1969, "A Miniature Two-Axis Fluxgate Magnetometer", by M. Acuna and C. Pellerin, pgs. 252–260.

As described in the above articles, one particular type of vector magnetometer is a fluxgate magnetometer. Many magnetometers use a toroidal core. A toroidal drive winding on the core is driven by a drive current which switches the core magnetization back and forth between positive and negative saturation. A sense winding also couples the core and detects the magnetic flux that closes outside the core. An electromagnetic force (emf), called a sense signal, is induced in the sense winding as a result of the combination of the drive current and any magnetic field intercepting the sensor. Normally, one magnetic field intercepting the sensor is the earth's magnetic field. Other magnetic fields to be detected may also be present. Whenever a vector magnetometer is moved around in the earth's magnetic field, large variations in the sense signal result as a function of the change in orientation of the sense winding sensitivity axis relative to the direction of the earth's magnetic field. For this reason, vector magnetometers by themselves are not satisfactory for detecting magnetic field anomalies in the presence of the earth's magnetic field unless the magnetometers are stationary in the earth's magnetic field and the anomalies are moved.

In order to overcome the orientation sensitivity of a single vector magnetometer, two magnetometers are mounted some distance apart and are interconnected to form a gradiometer. The two magnetometers are positioned with their sense winding axes antiparallel and with their windings equal in sensitivity. The sense signals from the magnetometers are algebraically added so that the positive sense signal due to the earth's field in one magnetometer tends to cancel the negative sense signal due to the earth's field in the other magnetometer. Under these conditions, changing orientations with respect to the earth's spacially uniform magnetic field tend not to cause any variation in the output signal. Accordingly, gradiometers are well suited for sensing the presence of magnetic field gradients or fields other than the uniform earth's field and in the presence of the earth's field. When gradiometers are battery operated, of light construction, and otherwise suitable for hand-held use, they are frequently employed for locating magnetic objects such as magnetic stakes.

An important construction requirement of such gradiometers is that the two magnetometer sensors have their sense winding axes as nearly antiparallel as possible. To the extent that the sense axes are not antiparallel, unwanted error components are introduced into the output sense signal. The error components, among other things, render the gradiometer sensitive to changes in orientation with respect to the earth's magnetic field.

A number of techniques have been employed to insure that the unwanted error components are minimized or cancelled. In one technique, precision mechanical alignment is employed to balance out the error components. While such an alignment technique may be acceptable in a laboratory environment, it is difficult to maintain proper alignment in portable instruments which are subject to vibration and shock in normal hand-held use. Furthermore, once the alignment is disturbed, realignment is difficult and has not proved entirely satisfactory.

In another prior art technique, a superconducting gradiometer is balanced to eliminate error components using a superconducting disc in the manner described in U.S. Pat. No. 3,976,938. While that solution works well in a superconducting environment, a superconducting gradiometer is not suitable for hand-held, portable operation and, therefore, there still is a need for a solution to the balancing problem.

Accordingly, in light of the above background, it is an object of the present invention to provide an improved gradiometer in which the sensors are readily balanced to remove unwanted error components and remain balanced over long periods of time, even in the presence of vibration, shock and temperature changes.

SUMMARY OF THE INVENTION

The present invention is a gradiometer for measuring magnetic field gradients. The gradiometer is formed by a number of magnetic field sensing devices. Each device has its own axis of sensitivity and produces a signal proportional to the magnetic field strength in the direction of its axis of sensitivity. The devices are mounted so that the different axes of sensitivity are at different angles to each other and so that at least some of the devices are displaced from each other along a common axis. The signals from the devices are combined so as to balance out unwanted components, particularly those due to the earth's magnetic field.

In a preferred embodiment, a gradiometer is formed by a pair of magnetometer sensors. Each sensor has a sense winding and a balance winding where the balance winding is orthogonal to the sense winding.

The balance winding for each sensor is positioned so that its axis of sensitivity in a balance direction is orthogonal to the axis of sensitivity of the sense winding in a sense direction. The sensors are rigidly connected along a common axis, for example, the Z axis, with their sense directions parallel. For example, one sense direction is in the positive X axis direction and the other sense direction is in the negative X axis direction. The balance directions for both of the sensors are orthogonal to each other. For example, when the balance direction for one of the sensors is in the Z axis direction, the balance direction for the other one of the sensors is in the Y axis direction.

For each sensor, a detector having a balance circuit is employed to combine a balance signal from the balance winding with a sense signal from the sense winding to form a combined signal. The balance signals are adjusted to cancel unwanted components due to any skew of the sense windings from their desired sense directions.

The combined signals from the balance circuits for each of the sensors are summed in an adder circuit to produce the gradiometer output signal. The combined signals are adjusted to be of equal but opposite magnitudes when the sensors detect equal magnetic field strengths, as produced, for example, by the uniform earth's field. The making of these adjustments is called "balancing the gradiometer". When the combined signals are summed algebraically, a null output is formed except when a magnetic field gradient exists. A gradient exists when one sensor senses a greater magnetic field strength than the other sensor. Once the gradiometer is properly balanced, the output from the adder circuit is a measure of the strength of the magnetic field gradient and is independent of the orientation of the gradiometer with respect to the earth's magnetic field.

In one particular embodiment, a feedback winding is located in each sensor to couple magnetically to a core and in an opposing direction to the field intercepting the core and being measured by the sense winding. The combined signal from the sense winding and the balance winding is integrated in an integrator to provide an integrated combined signal which drives the feedback winding with a current in a direction that tends to cancel the magnetic field intercepting the core and being measured by the sense winding. The integrator continues to alter its output, the integrated combined signal, until that output drives the combined signal input to a null condition. At the null condition, the magnitude of the output signal from the integrator, the integrated combined signal, is a measure of the strength of the magnetic field intercepting the sensor.

In accordance with the above summary the present invention provides electrical balancing of the sensors in a fluxgate gradiometer in an inexpensive and convient manner. The electrical balancing is stable against temperature changes and vibration and can have high resolution.

Because the balancing is electrical no mechanical access to the sensors is required for adjusting their orientation and the sensors, therefore, can be supported and mounted in an environment which protects them against shock and vibration.

Additional objects and features of the present invention will appear from the following description in which the preferred embodiments of the invention have been set forth in detail in conjunction with the drawings.

BRIEF DESCRIPTION OF THE DRAWINGS

FIG. 1 depicts a hand-held fluxgate gradiometer in accordance with the present invention.

FIG. 2 depicts a partial cut-away view of the FIG. 1 device showing the location of the two sensors displaced along a common axis.

FIG. 3 depicts a top view of the sensor portion of the FIG. 1 device looking at the YZ plane along the X axis.

FIG. 4 depicts a side view of the sensor of the FIG. 1 device looking at the XZ plane along the Y axis.

FIG. 5 depicts an XYZ coordinate system showing the axes of sensitivity of the FIG. 2 sensors.

FIG. 6 is an electrical block diagram of the electronic circuitry together with the sensors of FIGS. 2 through 4.

FIG. 7 depicts further details of the sensors and the detectors which form part of the FIG. 6 circuitry.

FIG. 8 depicts various waveforms descriptive of the operation of the FIG. 6 and FIG. 7 circuitry.

DETAILED DESCRIPTION

In FIG. 1, a gradiometer in accordance with the present invention is shown. The external structure of the gradiometer includes a handle 11, an electric housing 4 and an outer sensor tube 3. The gradiometer of FIG. 1 is utilized for detecting magnetic field gradients such as emanate, for example, from a magnetic stake 55. In normal use, the gradiometer is translated just above the ground 54 in order to locate the stake 55. In normal use, the magnetic field from the stake 55 must be detected in the presence of the earth's magnetic field. Since the end 12 of the sensor tube 3 normally will be closer to the stake 55 than the housing 4, the magnetic field from the stake is of greater strength near the end 12 then it is near the housing 4. For this reason, a magnetic field gradient is established along the sensor tube 3 between end 12 and housing 4.

The gradiometer of FIG. 1 includes audio and visual output devices for signalling the strength of the magnetic field gradient. Typically, the audio output increases in frequency the closer the tip 12 is to the stake 55.

In FIG. 2, further details of the sensor tube 3 are shown in a partial cut-away view. A first sensor 1 and a second sensor 2 are displaced along a common axis, the Z axis, within the outer sensor tube 3. The first tip sensor 1 includes a nonmagnetic bobbin 57 which holds a number of windings. A toroidal drive winding member 5 is wound around a toroid which is positioned within a slot in the bobbin 57. Sense windings 7 are wound around the bobbin 57. The windings 7 have a sensitivity axis in the X axis direction as designated by the vector Tx. The sensor 1 also includes a balance winding 9 wound around the bobbin 57 generally orthogonal to the windings 7. The balance winding 9 has a sensitivity axis generally in the Y axis direction as indicated by the vector Ty. In one embodiment, the toroid has an outside diameter of approximately 0.6 inch and fits within the cavity of the bobbin. The sense windings 7 have 270 turns while the balance winding has 16 turns.

In FIG. 2, the second upper sensor 2 is identical to the first sensor 1 except for its orientation. Sensor 2 has a bobbin 58, drive winding means 6, sense windings 8, and a balancing winding 10. The sense windings 8 have a sensitivity axis generally in the negative X axis direction as indicated by the vector Ux. The balance winding 10 has an axis of sensitivity generally in the Z axis direction as indicated by the vector Uz. In FIG. 2, the sensors 1 and 2 are rigidly connected together by a support, not shown in FIG. 2. Details of the support for the sensors 1 and 2 are shown in FIGS. 3 and 4.

In FIG. 3, a view of the internal assembly of the sensor tube 3 is shown looking along the X axis at the YZ plane. In FIG. 3, the sensors 1 and 2 are rigidly connected in common along the Z axis by the tubular support 63. The tubular support 63 includes one or more spacers 13 engaged about its perimeter. The spacers are made of a shock-absorbing material such as a foam plastic. The internal assembly including tubular support 63, the sensors 1 and 2, and the spacers 13 are inserted within the outer wall portion of sensor tube 3. Spacers 13 support the internal assembly and help isolate the sensors from shock and vibration. The use of two spacers decouples the inner support from any bending moment off the outer support. The location of the spacers, when properly selected, helps to minimize the unwanted bending effects due to acceleration and gravity. The most suitable location for the spacers may be determined experimentally. In the FIG. 3 embodiment, sensors 1 and 2 are approximately twenty inches apart and spacers 13 are approximately ten inches apart and five inches from either sensor, respectively.

In FIG. 3, a flat connector cable 64 extends from the electronic circuitry (not shown in FIG. 2) to a connector 66 for sensor 2 and to a connector 65 for the sensor 1. The connector cable 64 and the connectors 65 and 66 interconnect the various windings of the sensors 1 and 2 with the electronic circuitry in the manner hereinafter described.

In FIG. 3, the sensor 1 is shown rotated such that the vector Ty is not in the YZ plane and such that Ty appears at an angle in the clockwise direction relative to the Y axis direction. Similarly, the sensor 2 has been shown rotated such that the vector Uz is not in the YZ plane and such that Uz appears at an angle in the counterclockwise direction relative to the Z axis direction. These angular rotations of the windings, designated by the placement of the vectors Ty and Uz, represent the imperfect alignment which, although undesired, can occur during the manufacture and/or use of a gradiometer. In FIG. 3, the vectors Tx and Ux (the vectors of primary interest) have not been shown for clarity.

In FIG. 4, a view of the internal assembly of FIG. 2 looking along the Y axis at the XZ plane is shown. The sensor 1 is rigidly supported by the tabs 59 and 61 and the sensor 2 is rigidly supported by the tabs 60 and 62. The tabs 59 though 61 are each an extended portion of the wall of the tubular support 63.

The pair of tabs 59 and 61 and the pair of tabs 60 and 62 are typically formed by grinding away the center portion of the wall at each end of the tubular support 63.

In FIG. 4, sensor 1 has been shown with its axis of sensitivity, designated by the Tx vector, rotated clockwise by an angle relative to the X axis. Similarly, the sensor 2 has been shown so that its axis of sensitivity, designated by the vector Ux, is rotated counterclockwise by an angle relative to the X axis. In FIG. 4, the vectors Tx and Ux are not in the XZ plane as is apparent from FIG. 5. Further, in FIG. 4, the vectors Uz and Ty have not been shown for clarity.

In FIGS. 2, 3 and 4, it frequently occurs that the axes of sensitivity designated by the vectors Tx, Ty and Ux and Uz are not exactly parallel with the X, Y or Z axes. The nonparallelism is due to alignment errors which occur during manufacture or which subsequently occur. To the extent that the Tx and the Ux vectors are not parallel with each other, the magnetic fields sensed by sensors 1 and 2 and due to the earth's field will not cancel. If the components due to the earth's field are not cancelled, then the instrument will have a significant error. The Ty and the Uz vectors are, in accordance with the present invention, utilized to balance any misalignment of the Tx and the Ux vectors.

In FIG. 5, the vectors Tx and Uz are shown in a nonparallel and therefore misaligned orientation which represents a misalignment of the sensors in FIGS. 2, 3 and 4. The Tx vector has its projection onto the YZ plane rotated at angle $\theta_T$ from the Z axis. Also, the vector Tx is rotated from the X axis by an angle of $\phi_T$. The vectors Ty and Uz are not shown in FIG. 5, for clarity.

In a similar manner in FIG. 5, the Ux vector has its projection on the YZ plane rotated at an angle $\theta_U$ from the Z axis direction and is rotated at an angle $\theta_U$ from the negative X axis. Under these conditions, the Tx and Ux vectors are not antiparallel and hence will render the instrument sensitive to changes in orientation with respect to the earth's magnetic field. The sensitivity to the earth's field is caused by error terms resulting from the components of the Tx vector in the Y and Z axes direction. Specifically, the Tx vector has a component Tx$_z$ in the Z axis direction given as follows:

$$Tx_z = (Tx) \sin \phi_T \cos \theta_T \qquad \text{Eq.(1)}$$

The vector Tx has a component in the Y axis direction given as follows:

$$Tx_y = (Tx) \sin \phi_T \sin \theta_T \qquad \text{Eq.(2)}$$

The Tx vector has a component in the positive X axis direction given by the following:

$$Tx_x = (Tx) \cos \phi_T \qquad \text{Eq.(3)}$$

In a similar manner, the vector Ux has components in the Z, Y and X directions, respectively, as follows:

$$Ux_z = (Ux) \sin \phi_U \cos \theta_U \qquad \text{Eq.(4)}$$

$$Ux_y = (Ux) \sin \phi_U \sin \theta_U \qquad \text{Eq.(5)}$$

$$Ux_x = (Ux) \cos \phi_U \qquad \text{Eq.(6)}$$

In order for the vectors Tx and Ux to cancel the effects of the earth's magnetic field, the X axis components Tx$_x$ and Ux$_x$ must be of equal magnitude. Furthermore, the Z axis components, Tx$_z$ and Ux$_z$ must be cancelled and the Y axis components, Tx$_y$ and Ux$_y$, must be cancelled.

In accordance with the present invention, the unwanted Y axis components of the Tx and Ux vectors are cancelled by employing the Ty vector, adjusted for magnitude and sign, and the unwanted Z axis components of the Tx and Ux vectors are cancelled using the Uz vector, adjusted for magnitude and sign. The cancellation is carried out electrically in the manner hereinafter described in connection with FIGS. 6, 7 and 8.

In FIG. 6, the sensors 1 and 2 are the same as previously described in connection with FIGS. 2 through 5. The circuitry 14, in FIG. 6, is included within the housing 4 of the gradiometer of FIG. 1. In FIG. 6, a conventional power supply 30, normally battery powered, energizes all of the other circuits. An oscillator 17 provides an oscillating signal connected through a driver 18 for driving the drive windings of both the sensors 1 and 2. Oscillator 17 typically has a frequency of 8 KHz. When so driven, the sensors 1 and 2 detect the magnetic field and provide outputs on the lines 31 and 32, respectively. Lines 31 from sensor 1 connect to a first detector 15 and lines 32 from sensor 2 connect to a second dectector 16.

Detector 15 detects both the sense signals and the balance signals from the sensor 1 and detector 16 detects both the sense signals and the balance signals from sensor 2. Detector 15 provides a combined output signal on line 23 representing the strength of the magnetic field detected by sensor 1 as combined with the balance signal from sensor 1. Similarly, detector 16 detects the strength of the magnetic field at sensor 2 combined with the balance signal from sensor 2. The combined signals on lines 23 and 24 are algebraically summed by the adder circuit 25.

In general, the component of the earth's magnetic field represented in the signal on line 24 is of equal magnitude, but of opposite sign, to the component of the earth's magnetic field represented by the signal on line 23. Therefore, the adder circuit 25 tends to cancel the effect of the earth's magnetic field in providing the adder output signal on line 26. The signal on line 26 is proportional to the difference in the magnetic field strength detected in sensors 1 and 2. The earth's magnetic field is essentially the same at each of the sensors 1 and 2.

The adder output signal on line 26 may be either positive or negative depending upon the direction of the magnetic field relative to the sensors 1 and 2. The absolute value circuit 27 forms the absolute value of the signal on line 26, independent of its positive or negative sign, to produce an absolute value output signal on line 67. The magnitude of the signal on line 67 is, therefore, a measure of the magnetic field gradient as sensed by the sensors 1 and 2.

One or more convenient output devices are provided to indicate the magnitude of the signal on line 67. As shown in FIG. 6, one output device is a conventional audio output device 28. For example, audio device 28 typically includes a voltage controlled oscillator which produces an audio range output signal having a frequency which varies as a function of the voltage level on line 67. The higher the voltage level on line 67, the higher the frequency of the voltage controlled oscillator output signal. A conventional speaker connected to the output of the voltage control oscillator produces an output sound which varies in frequency as a function of the voltage level on line 67.

In FIG. 6, a conventional output meter 29 provides a visual output signal indicative of the level of the signal on line 67. In general, the higher the voltage level on line 67, the closer the tip sensor 1 is to a device to be located such as stake 55 shown in FIG. 1.

In FIG. 7, further details of the FIG. 6 circuitry are shown. In FIG. 7, the sensor 1 includes a driving winding 5, a Y balance winding 9, windings 7, including a sense winding 39 and a feedback winding 37. All of the windings 5, 7 and 9 magnetically couple the ferrite ring 35 in the manner previously described in connection with FIGS. 2 through 5.

In a similar manner, the sensor 2 in FIG. 7 includes a drive winding 6, sense windings 8, including the sense winding 40 and the feedback winding 38 and a Z balance winding 10. All of the windings 6, 8 and 10 magnetically couple the ring 36 in the manner previously described in connection with FIGS. 2 through 5.

In FIG. 7, the four output lines 31 from the sensor 1 connect to the tip detector 15 and the four lines 32 connect to the upper detector 16. The drive lines 33 connect to the drive windings 5 and 6 from the driver circuit 18 of FIG. 6.

In FIG. 7, the detector circuit 15 includes a balancing circuit 45. The balancing circuit 45 receives the balancing signal from the balancing winding 9 and connects it across the balance resistors 74 and 70 which are of equal resistance (e.g. 22.1 ohms). The center tap between the resistors 74 and 70 connects to one end of the sense winding 39, the other end connecting to ground. Variable tap resistor 71 is connected to receive the output from the balancing winding 9 across resistors 69 and 70. When the tap on resistor 71 is at the center position, the output from the balancing winding 9 is equally divided and hence has no effect to either increase or decrease the sense signal on line 41 from sense winding 39. Adjusting the center tap on resistor 71 toward one side or the other of the center position increases the portion of the balancing signal from the winding 9 added to or subtracted from the sense signal on line 41. The signal on line 41 represents the Tx vector and the signal from winding 9 represents the Ty vector as discussed in connection with FIGS. 2 through 5. The center tap on resistor 71 adjusted until the adjusted portion of the Ty vector equals in magnitude, and is of opposite signal of the Y axes components of Tx and of Ux, identified as $Tx_y$ and $Ux_y$ as given by Eq.(2) and Eq.(5).

The combined signal on line 68 is then sampled by a sampling transistor 47. The sampling rate of transistor 47 is controlled by the gate input on line 21 from the frequency doubler circuit 19 of FIG. 6. The frequency doubler circuit 19 is a standard device for doubling the frequency of the oscillator 17 output and which has an adjustable duty cycle. The sampled output from transistor 47 on line 69 is the input to an integrator 49.

Integrator 49 integrates the sampled combined input signal on line 69. The integrated combined output signal on line 23 is fed back through a variable resistor 53 (e.g., 0 to 100 ohms) and a fixed resistor 51 (e.g. 453 ohm) to drive the feedback winding 37. As indicated by the dots on the windings 37 and 39, they are wound in the same direction. The feedback current from the output of integrator 49 on line 23 applies a field in the core opposite to the intercepted field. Therefore, the signal from the feedback winding 37 tends to cancel the signal from sense winding 39. The integrator 49 integrates the sampled combined output signal on line 69 until the signal in feedback winding 37 just cancels the signal in winding 39. Under these cancelled conditions, the sampled combined output signal on line 69 is a null and the integrated combined output signal from the integrator 49 on line 23 is a measure of the magnitude of the sense signal from the sense winding 39 as balanced.

The use of a servo feedback winding significantly increases the linearity of the magnetometer and therefore increases the accuracy to which a gradiometer can be balanced over all values of magnetic field strength within the range of the magnetometer.

In FIG. 7, the upper detector 16 is identical, in most regards, to the detector 15. Corresponding elements in detector 16 have the same number as the elements in detector 15 with a prime added. The detector 16 differs from the detector 15 in that the feedback resistor 52 in detector 16 is a fixed value (e.g., 499 ohms) while the feedback resistor 53 in the detector 15 provides a variable adjustment. The fixed resistor 51 in detector 15 is a lower value than the resistor 52 in detector 16. The variable value of resistor 53 permits the resistance value to the feedback winding of detector 15 to be adjusted from a value below that of the resistor 52 to a value above that of resistor 52 in detector 16 depending upon the setting of the center tap of resistor 53. The adjustment of resistor 53 enables the X axis component of the vector Tx as given in Eq.(3) be made equal to the X axis component of the Ux vector as given by Eq.(6). Of course, any X axis components of the Ty and Uz vectors are also affected by the resistor 53 adjustment.

In FIG. 7, the balancing circuit 45' allows the balancing signal, represented by vector Uz from the balancing winding 10, to be added into the sense signal on line 41' so as to cancel the Z axis components of the vectors Tx and Ux, identified as $Tx_z$ and $Ux_z$ and given by Eq.(1) and Eq.(4).

In FIG. 8, waveforms representative of the operation of the FIG. 6 circuitry are shown. The oscillator signal 20 has a frequency of 8 KHz and is output on line 20 to a drive circuit 18 and to a frequency doubler circuit 19. The circuit 19 produces a signal on line 21, shown in broken line in FIG. 8, which is twice the frequency of the oscillator 20 signal, shown in solid line in FIG. 8. The drive voltage on line 33, driving the drive windings 5 and 6 in FIG. 7, has a waveform shown in FIG. 8 which has the basic frequency of the oscillator signal 20. The drive voltage 33 has a positive-going transition at time t0 corresponding to the positive-going transition of the oscillator signal 20 at t0. At about t2 time, however, the core 35 becomes saturated so that the drive voltage returns to the lower level. At time t4, the negative-going transition of the oscillator signal on line 20 starts to drive the core 35 in the opposite direction so that at t6 the core 35 is saturated and the drive voltage again falls off. The saturization of the cores occurs twice per cycle, once for the positive-going and once for the negative-going transition of the oscillator signal.

During the time that the drive winding is being driven into saturation, the sense winding 39 will provide a sense signal proportional to the strength of the magnetic field to the extent that the field has not been nulled by the operation of the feedback signal to the feedback winding. The feedback signal is the integrated combined signal output on line 23. In FIG. 8 at time t0 it has been assumed that the integrated combined signal output from the integrator is zero amplitude so that the signal on line 41 is the unnulled sense signal proportional to the magnetic field strength. As shown in FIG. 8 for the waveform 41, a magnetic field gives rise to a pulse between t0 and t1 having an amplitude representative of the magnetic field strength.

The pulse between t0 and t1 from the sense winding is combined with the appropriately scaled Y axis correction, applied in the balance circuit 45, to provide a combined signal on line 68. Although the combined signal is not shown in FIG. 8, the combined signal has the same shape as the pulse on line 41, but with a higher or lower amplitude depending on the sign and the magnitude of balancing produced by the balance circuit 45. The balancing sign and magnitude are determined experimentally during manufacturing.

The combined signal on line 68 is sampled by the sample gate 47 during the period that the sample gate control signal, waveform 21, is low which occurs, for example, between t0 and t2.

The sampled combined signal on line 69 is input to the integrator 49 which integrates that signal to provide the integrated combined signal, $L_T$, on line 23. As shown in FIG. 8, the signal on line 23 increases between t0 and t1 from the assumed 0 starting level up to an initial amplitude. Between t1 and t4, the signal on line 23 is fed back to the feedback winding and tends to cancel the magnetic signal induced in the sense winding 39. At the next sample gate time between t4 and t6, the amplitude of the Tx waveform on line 41 has been reduced, by the amount of the feedback signal. It has been assumed that the magnetic field strength in the sensor 1 has remained constant. As shown in FIG. 8, the integrator output keeps increasing and the Tx signal on line 41 keeps decreasing until sometime after t12. After t12, the Tx signal has been reduced to a null condition and the integrator output remains at a constant level which holds the Tx signal at the null condition. The waveforms of FIG. 8 have been simplified in that the total number of pulses required to reduce the sense signal to a null condition, in general will be many more than shown.

In FIG. 8, sometime after the Tx signal has been reduced to the null condition, a change in the magnetic field is sensed. At t20, the magnetic field is in the opposite direction as that previously sensed between t0 and t12. That opposite direction results in a sense pulse which in turn causes the integrator output to be reduced between t20 and t21. Similarly, at t24 and t28 and t32, the integrator output becomes increasing less positive and more negative. It should be noted that between t20 and t28, the integrator and the feedback signal drive the sense signal toward a null condition. At t32, however, the Tx sense signal on line 41 jumps to a higher amplitude notwithstanding the null-driving operation of the integrator. This type of operation occurs, for example, whenever the magnetic field strength sensed by the sensor 1 is changing, for example, when the instrument of FIG. 1 is being moved in close proximity to a local magnetic field such as produced by a stake 55.

While the FIG. 8 description has been directed to the operation of the sensor 1 and the detector 15, a substantially identical operation occurs for the sensor 2 and the detector 16. The integrated combined signal, $I_U$ on line 24, is generally of the opposite sign as the signal on line 23 when the magnetic field strength sensed by both sensor 1 and sensor 2 are the same. For this reason, the adder circuit algebraically adds positive and negative signed signals. Considered in another way, the adder can subtract a positive signal from another positive signal since the inversion in sign can be achieved in different ways.

In the example of FIG. 7 and as described in connection with FIGS. 2 through 5, the sensors 1 and 2 are oriented so as to have their axes of sensitivity in an antiparallel direction. That is, the sensor 1 has an axis of sensitivity in the positive X axis direction and the sensor 2 has an axis of sensitivity in the negative X axis direction. These opposite directions give rise to opposite signals for the signals input to the adder circuit 25 of FIG. 6. In FIG. 7, the dots for the windings 37 and 39 in sensor 1 are at opposite ends relative to the dots for the windings 38 and 40 in sensor 2. These dots schematically indicate the opposite directions of the sense axes of sensitivity. While the opposite signs have been achieved as a result of the orientation of the sensors 1 and 2 as shown in FIG. 2, alternative ways of providing the sign inversion are available. For example, the axes of sensitivity can be parallel in the same direction and the signals can then be electrically inverted, for example, in one of the detectors 15 or 16.

FURTHER AND OTHER EMBODIMENTS

While the preferred embodiments of the present invention have been described with a single balancing winding on each of the sensors, the balance windings can be positioned at different locations. For example, two balance windings can be located on a single sensor eliminating the need for any balance windings on the other sensor. As another alternative, one or more separate balancing magnetometers can be provided. In such an alternative, one balance winding has an axis of sensitivity in the Z axis direction and another has an axis of sensitivity in the Y axis direction. While the present invention covers such alternative embodiments, they are generally less desirable for portable, hand-held devices because of the additional complexity.

While the present invention has been described in connection with a gradiometer sensitive to field components only in one direction, for example, the X axis direction, the invention applies to gradiometers with two or more axes of sensitivity. For hand-held, portable stake locators, however, the additional complexity required for more than one axis of sensitivity is generally not warranted.

In the preferred embodiments described, the axes of sensitivity are in the X axis direction at an angle which is orthogonal to the Z axis which is the common axis between the first and second sensors. Of course, either the Y axis or the Z axis can be the axis of sensitivity within the spirit of the present invention. It has been found, however, that the X axis orientation, that is an axis orthogonal to the common axis between the sensors has an advantage. The advantage is that as the sensor tip 12, see FIG. 1, is translated along the ground toward a stake 55, the frequency of the audible signal will increase up to a point just in front of the stake 55. At that point, a null in the gradient will be reached and the audio output will indicate a null (usually by silence). If the gradiometer is moved further, the output will again be of high frequency. At a point where a null in the audio output occurs, the axis of the gradiometer (that is, the Z axis) is preferrably made normal to the ground. Then the repositioning of the gradiometer (maintained normal) until the null is again located will locate the magnetic object directly below the tip 12.

Although preferred embodiments have been described in connection with flux-gate magnetometers and associated sense and balance windings, other magnetic field sensing devices can be employed. For example, a hall-effect sensors, rotating coil sensors such as gauss meters, and other similar devices are within the scope of the present invention.

The present invention is not limited to sense and balance magnetic sensing devices having axes of sensitivities which are orthogonal. Although the sense and balance windings in one preferred embodiment are orthogonal, other angles may be employed. Furthermore, the sense devices and the balance devices can share each others functions since the "sense" and "balance" labels are somewhat arbitrary.

While the invention has been particularly shown and described with reference to the preferred embodiments thereof, it will be understood by those skilled in the art that those changes in form and details may be made therein without departing from the spirit and the scope of the invention.

What is claimed is:

1. A gradiometer for sensing a magnetic field gradient comprising,
    a first sensor having a first sense winding for sensing magnetic field strength in a first sense direction and having a first balance winding for sensing magnetic field strength in a first balancing direction orthogonal to said first sense direction,
    a second sensor having a second sense winding for sensing magnetic field strength in a second sense direction and having a second balance winding for sensing magnetic field strength in a second balance direction orthogonal to said second sense direction,
    means for rigidly connecting said first and second sensors in spaced apart relation along a common axis with said first and second sense windings oriented such that said first and said second sense directions are parallel and with said first and second balance windings oriented such that said first and second balancing directions are orthogonal,
    first detector means for detecting a first sense signal from said first sensing winding and a first balance signal from said first balance winding, said first detector means including first combining means for combining said first sense signal and said first balance signal to provide a first combined signal,
    second detector means for detecting a second sense signal from said second sense winding and a second balance signal from said second balance winding, said second detector means including second combining means for combining said second sense signal and said second balance signal to provide a second combined signal such that said second combined signal is opposite in sign to said first combined signal,
    adder means for algebraically summing said first and second combined signals to provide an adder output signal proportional to the difference between the magnetic field strength at said first sensor and the magnetic field strength at said second sensor in directions parallel to said first and second sense directions, respectively, with unwanted components in said first and second balance directions cancelled.

2. The gradiometer of claim 1 wherein said first and second sensors include first and second feedback windings, respectively, positioned to oppose the magnetic field sensed by said sense windings, and wherein said first and second detectors include first and second integrators, respectively, said integrators connected to receive as inputs said first and second combined signals, respectively, said integrators forming as output signals first and second integrated combined signals, respectively, said first and second integrated combined signals connected to drive said first and second feedback windings, respectively, and operational to drive said first and second combined signals to a null, said first and second integrated combined signals providing said combined signals as the inputs to said adder means.

3. The gradiometer of claim 2 wherein said first and second detector means include first and second sampling gates, respectively, said sampling gates for connecting said first and second combined signals, respectively, when sampled as inputs to said first and second integrators, respectively, and means for actuating said sampler gates at twice the frequency of said drive signal.

4. The gradiometer of claim 1 including an absolute value circuit for forming the absolute value of said adder output signal to provide an absolute value signal proportional to the magnitude of the magnetic field gradient between said first and second sensors.

5. The gradiometer of claim 4 including an audio output circuit providing an audio output proportional in frequency to the amplitude of said absolute value signal.

6. The gradiometer of claim 4 further including meter means for providing a visual output signal proportional to the amplitude of said absolute value signal.

7. The gradiometer of claim 1 in which each of said sensors includes a fluxgate magnetometer having a drive winding coupling a magnetic core and where said sense winding and said balance winding also couple said magnetic core and including drive means for driving said core alternately into positive and negative saturization whereby the induced signal in said sense winding is proportional to the magnetic field intercepting said magnetic core.

8. The gradiometer of claim 1 wherein said first and said second sensors are mounted in fixed relationship to each other at either end of a tubular support member.

9. The gradiometer of claim 11 in which said tubular support member includes tabs on diametrically opposed sides of said tubular member for engaging said first and second sensors in fixed relationship.

10. The gradiometer of claim 12 wherein connections to said first and second sensors are made through the center portion of said tubular support member.

11. The gradiometer of claim 13 wherein said tubular support member includes one or more spacers about the outer diameter of said tubular support member and wherein said gradiometer further includes an outer tube where the inner diameter of said outer tube is approximately the same diameter as said spacers whereby said tubular support member and the attached sensors and spacers fit snugly within said outer tube.

12. The gradiometer of claim 1 wherein said first and second sense directions are orthogonal to said common axis.

13. The gradiometer of claim 1 wherein said first and second sense directions are parallel but in opposite directions.

14. The gradiometer of claim 1 wherein each of said combining means includes a pair of resistors connected in series at a center point, where said balance winding is connected across said pair of resistors and where said sense winding is connected at said center point and including a resistor with a variable center tap, said tapped resistor connected in parallel with said pair of resistors whereby said center tap is adjustable to add or subtract a selected portion of the balance signal from said sense signal to provide said combined signal.

15. The gradiometer of claim 1 including first and second sensors formed of first and second fluxgate magnetometers having drive windings coupling magnetic cores and where said first and second sense windings and said first and second balance windings couple said magnetic cores, respectively, including drive means for driving said cores alternately into positive and negative saturation whereby the induced signal in said sense windings are proportional to the magnetic fields intercepting said magnetic cores, respectively.

16. The gradiometer of claim 15 wherein said first and said second sensors are mounted in fixed relationship to each other at either end of a tubular support member.

17. The gradiometer of claim 16 in which said tubular support member includes tabs on diametrically opposed sides of said tubular member for engaging said first and second sensors in fixed relationship.

18. The gradiometer of claim 17 wherein connections to said first and second sensors are made by a first cable through the center portion of said tubular support member to connections for said first and second sensors.

19. The gradiometer of claim 18 wherein said tubular support member includes one or more shock-absorbing spacers about the outer diameter of said tubular support member and wherein said gradiometer further includes an outer tube where the inner diameter of said outer tube is approximately the same diameter as said spacers whereby said tubular support member and the attached sensors and spacers fit snugly within said outer tube.

20. A gradiometer for sensing a magnetic field gradient comprising, a first sense winding for sensing magnetic field strength in a first sense direction and providing a first sense signal corresponding thereto, a first balance winding for sensing magnetic field strength in a first balance direction orthogonal to said first sense direction and providing a first balancing signal corresponding thereto, a second sense winding for sensing magnetic field strength in a second sense direction and providing a second sense signal corresponding thereto, a second balance winding for sensing magnetic field strength in a second balance direction orthogonal to said second sense direction and providing a second balancing signal corresponding thereto, means for rigidly connecting said first and second sense windings in spaced apart relation along a common axis with said first and second sense windings oriented such that said first and second sense directions are parallel and for rigidly connecting said first and second balance windings relative to said sense windings such that said first and second balance directions are orthogonal, and combining means for combining a representation of said first and second sense signals and said first and second balanceing signals to provide an output signal proportional to the difference between the magnetic field strength at said first sense winding and the magnetic field strength at said second sense winding in directions parallel to said first and second sense directions, respectively, with unwanted components in said first and second balance directions cancelled.

21. The gradiometer of claim 20 including first and second feedback windings positioned to magnetically couple said first and second sense windings in an opposing direction, and including first and second integrators connected to receive as inputs said first and second sense signals, respectively, said integrators forming as output signals first and second integrated signals, respectively, said first and second integrated signals connected to drive said first and second feedback windings, respectively, and operational to drive said first and second sense signals to a null, said first and second integrated signals providing representations of said first and second sense signals as the inputs to said combining means.

22. The gradiometer of claim 20 wherein said first and second sense directions are orthogonal to said common axis.

23. A gradiometer for sensing a magnetic field gradient comprising, first sense means for sensing magnetic field strength in a first sense direction and providing a first sense signal corresponding thereto, first balance means for sensing magnetic field strength in a first balance direction orthogonal to said first sense direction and providing a first balance signal corresponding thereto, second sense means for sensing magnetic field strength in a second sense direction and providing a second sense signal corresponding thereto, second balance means for sensing magnetic field strength in a second balance direction orthogonal to said second sense direction and providing a second balance signal corresponding thereto, means for rigidly connecting said first and second sense means in spaced apart relation along a common axis with said first and second sense means oriented such that said first and said second sense directions are generally parallel and for rigidly connecting said first and second balance means relative to said sense means such that said first and second balance directions are orthogonal, and combining means for combining a representation of said first and second sense signals and said first and second balance signals to provide an output signal proportional to the difference between the magnetic field strength at said first sense means and the magnetic field strength at said second sense means in directions parallel to said first and second sense directions, respectively, with unwanted components in said first and second balance directions cancelled.

24. A gradiometer for sensing a magnetic field gradient comprising, a plurality of magnetic field sensing devices each providing a device signal indicating the magnetic field strength in a device direction, means for rigidly connecting said devices together in spaced relation along a common axis with first and second ones of said devices having different device directions than third and fourth ones of said devices, and combining means for combining representations of the device signals from each of said devices to form an output signal, said combining means having means for adjusting the relative contribution of said device signals to the output signal such that unwanted signal components due to magnetic fields intercepting each of said devices with uniform strength are balanced out leaving said output signal as a measure of magnetic field strengths intercepting said devices nonuniformly.

* * * * *